United States Patent [19] [11] Patent Number: 4,546,725
Shirahata et al. [45] Date of Patent: Oct. 15, 1985

[54] APPARATUS FOR MANUFACTURING MAGNETIC RECORDING MEDIA

[75] Inventors: Ryuji Shirahata; Masaru Sekine; Goro Akashi, all of Kanagawa, Japan

[73] Assignee: Fuji Photo Film Co., Ltd., Kanagawa, Japan

[21] Appl. No.: 587,421

[22] Filed: Mar. 8, 1984

[30] Foreign Application Priority Data
  Mar. 8, 1983 [JP] Japan ................................. 58-37906

[51] Int. Cl.⁴ ........................................... C23C 13/10
[52] U.S. Cl. ................................. 118/718; 118/724; 118/726; 118/729; 427/255.5; 427/132
[58] Field of Search ............ 118/718, 726, 724, 728, 118/729, 730; 427/255.5, 48, 128, 132

[56] References Cited
  U.S. PATENT DOCUMENTS
  4,450,186  5/1984  Shinohara ......................... 118/720
  FOREIGN PATENT DOCUMENTS
  54-13996  2/1979  Japan ................................. 427/132
  56-33810  4/1981  Japan ................................. 427/128

Primary Examiner—Norman Morgenstern
Assistant Examiner—Bernard F. Plantz
Attorney, Agent, or Firm—Sughrue, Mion, Zinn, Macpeak, and Seas

[57] ABSTRACT

A magnetic recording medium manufacturing apparatus is comprised of a cooling rotary cylinder can and a small roller, arranged adjacent to each other. A flexible endless belt is laid over the can and roller and carries a tape-shaped support. A ferromagnetic material, evaporated from an evaporation source disposed below the can and roller, is vacuum-deposited onto the tape-shaped support.

5 Claims, 2 Drawing Figures

APPARATUS FOR MANUFACTURING MAGNETIC RECORDING MEDIA

BACKGROUND OF THE INVENTION

This invention relates to a method of manufacturing a magnetic recording medium by vacuum-depositing a magnetic film on a tape-shaped support, such as a polymer product which is being moved.

Heretofore, a coated magnetic recording medium has been extensively employed in the prior art. It is manufactured as follows: a magnetic paint is prepared by dispersing a magnetic powder such as an oxide magnetic powder of $\gamma$-$Fe_2O_3$, $\gamma$-$Fe_2O_3$ doped with Co, $Fe_3O_4$ doped with Co, a berthollide compound of $\gamma$-$Fe_2O_3$ and $Fe_3O_4$, a berthollide compound doped with Co or $CrO_2$, or a ferromagnetic alloy powder essentially containing a transition metal of Co, Ni or Fe in an organic binder of vinyl chloride - vinyl acetate copolymer, stylene - butadiene copolymer, epoxy resin, or polyurethane resin. The magnetic paint thus prepared is applied to a nonmagnetic support, orientated and dried, to form a magnetic layer thereon.

Recently there has been a strong demand for recording data with high density. Accordingly, attention is paid to a so-called "metal film type magnetic recording medium" in which no organic binder is used, and the magnetic recording layer is a ferromagnetic metal film which is formed by a vapor deposition method such as a vacuum deposition method, a sputtering method, or an ion plating method, or a plating method such as an electroplating method or an electroless deposition, and efforts have been made to put the metal film type magnetic recording medium to practical use.

In the conventional coated type magnetic recording medium, a metal oxide small in saturation magnetization is used as the magnetic material, and the volume of the magnetic material content of the magnetic layer is only 30 to 50%. Accordingly, employment of the recording medium as a high-output high-density recording medium is limited. Furthermore, the conventional recording medium is disadvantageous in that the manufacturing process is intricate and large auxiliary equipment is required in order to recover solvents or to prevent pollution.

The metal film type magnetic recording medium is advantageous in that ferromagnetic metal, higher in saturation magnetization than oxide magnetic material, can be provided in the form of a film without using a non-magnetic material such as an organic binder. For recording data with high density, the gap of recording and reproducing magnetic heads has been reduced to less than 1.0 $\mu$m. Accordingly, the tendency has been to reduce the recording depth of the magnetic recording layer. Thus, the metal film type magnetic recording medium in which the entire thickness of the magnetic film can be used for recording magnetic signals is excellent as a high-output, high-density recording medium. Especially practical in use is an oblique incidence vacuum deposition recording medium, in which vacuum deposition is carried out by obliquely applying a ferromagnetic material vapor beam to the surface of a support, because it uses a relatively simple procedure, equipment and mechanism, and can provide films with excellent magnetic characteristics.

In a conventional oblique incidence vacuum deposition method, the vapor of ferromagnetic material from a ferromagnetic material evaporating source is applied at a predetermined incidence angle or with a range of incidence angles to a tape-shaped support which is moved along the cylindrical wall of a cooling rotary cylinder can.

FIG. 1 shows the essential components of a magnetic recording medium manufacturing apparatus for practicing the conventional oblique incidence vacuum deposition method. A cooling rotary cylinder can 11 is disposed in a vacuum chamber (not shown) which is evacuated by suitable vacuum pumps (not shown). As the can 11 rotates, a tape-shaped support 12 supplied from a supply roll (not shown) is conveyed along the cylindrical wall of the can 11. A ferromagnetic material evaporating source 13 is provided below the can 11, so that the vapor beam of ferromagnetic material from the source 13 is applied to the moving tape-shaped support 12 in the region which is not covered by an oblique mask 15 provided under the can 11. Thus, the vapor beam of the ferromagnetic material is applied to the tape-shaped support 12 within a certain range of incident angles, with the surface of the support 12 within the angle $\alpha$ being vacuum-deposited with ferromagnetic material. In this operation, only the vapor beam 14 spreading with an angle $\alpha$ reaches the tape-shaped support 12.

However, in the above-described conventional apparatus, the ratio of the amount of ferromagnetic material reaching the tap-shaped support from the evaporating source to the amount of ferromagnetic material provided by the evaporating source, namely, the efficiency of vacuum disposition, is low. This makes it difficult to utilize the conventional apparatus in the industrial field.

SUMMARY OF THE INVENTION

Accordingly, an object of this invention is to provide a magnetic recording medium manufacturing apparatus in which the above-described difficulties accompanying the conventional magnetic recording medium manufacturing apparatus have been eliminated and ferromagnetic materials can be efficiently vacuum-deposited onto the tape support.

The foregoing object and other objects of the invention have been achieved by the provision of a magnetic recording medium manufacturing apparatus which, according to the invention, comprises: a cooling rotary cylinder can; a small roller, the can and small roller being arranged in a vacuum atmosphere in such a manner that the small roller is adjacent to the can and the lowest point on the cylindrical wall of the small roller is lower than the lowest point on the cylindrical wall of the can; and a flexible endless belt laid over the can and the small roller, wherein a ferromagnetic material evaporated from an evaporation source disposed below the can and the small roller is vacuum-deposited onto a tape-shaped support which is obliquely moved along the flexible endless belt which is cooled by the cooling rotary cylinder can.

DETAILED DESCRIPTION OF THE INVENTION

One example of a magnetic recording medium manufacturing apparatus according to the invention will be described with reference to the accompanying drawing.

Figure 1:
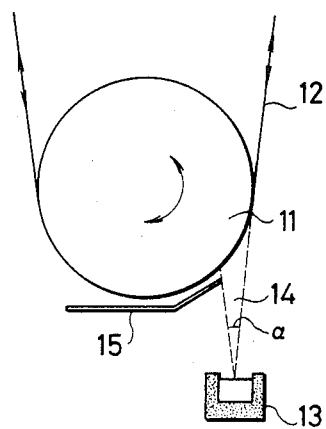
FIG. 1 is a side view showing the essential components of a conventional apparatus for manufacturing a magnetic recording medium.
Figure 2:
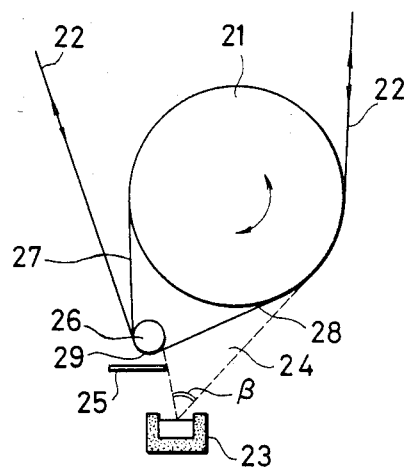
FIG. 2 is a side view showing the essential components of an apparatus for manufacturing a magnetic recording medium according to this invention.

FIG. 2 shows the magnetic recording medium manufacturing apparatus of the invention. A cooling rotary cylinder can 21 is arranged in a vacuum chamber (not shown) which has been made vacuous by suitable vacuum pumps (not shown). A small roller 26 is provided near the cylinder can 21. A flexible endless belt 27 is laid over the can 21 and the roller 26. A tape-shaped support 22 supplied from a supply roll (not shown) is conveyed by the flexible endless belt 27 laid over the can 21 and the roller 26, and an evaporation source 23 for providing a vapor beam 24 of ferromagnetic material is disposed below the can 21 and 26, so that the vapor beam 24 from the evaporation source 23 is applied to the tape-shaped support 22 which is run as described above. More specifically, the vapor beam 24 reaches the moving tape-shaped support 22 in the region which is not covered by an oblique mask 25, so that the vapor beam 24 is obliquely applied to the tape-shaped support 22 and deposited thereon. In this operation, the vapor beam 24, covering an angle $\beta$ is vacuum-deposited on the tape-shaped support 22. The angle $\beta$ is larger than the angle $\alpha$ in FIG. 1. That is, the efficiency of vacuum evaporation of the apparatus of the invention is much higher than that of the conventional apparatus. In the apparatus of the invention, the flexible endless belt 27 is sufficiently cooled down while moving along the cooling cylinder can 21. Accordingly, the tape-shaped support 22, to which the vapor beam is applied, is cooled by the endless belt 27 while being conveyed.

It is preferable that the cooling can 21 is turned clockwise in FIG. 2. In order for the vapor beam to be applied obliquely, with an incidence angle of at least 30° to the tape-shaped support 22 which is moved by the flexible belt 27, it is desirable that the radius r of the small roller 26 be smaller than one-third ($\frac{1}{3}$) of the radius r of the cooling rotary cylinder can 21. In addition, it is preferable that the lowest point 29 on the cylindrical wall of the small roller 26 be lower than the lowest point 28 on the cylindrical wall of the cooling rotary cylinder can 21.

Examples of the ferromagnetic metal for forming the magnetic film which is used for manufacturing the magnetic recording medium with the vacuum-depositing device according to the invention are metals such as Fe, Co and Ni, and ferromagnetic alloys such as Fe—Co, Fe—Ni, Co—Ni, Fe—Co—Ni, Fe—Rh, Fe—Cu, Co—Cu, Co—Au, Co—Y, Co—La, Co—Pr, Co—Gd, Co—Sm, Co—Pt, Ni—Cu, Mn—Bi, Mn—Sb, Mn—Al, Fe—Cr, Co—Cr, Ni—Cr, Fe—Co—Cr and Fe—Co—Ni—Cr. The magnetic film should be thick enough to allow the magnetic recording medium to provide a sufficiently high output, and thin enough to record data with high density. Therefore, in general, the thickness of the magnetic film is 0.05 $\mu$m to 1.0 $\mu$m, preferably 0.1 $\mu$m to 0.4 $\mu$m. The tape-shaped support is a plastic support of polyethylene terephthalate, polyimide, polyamide, polyvinyl chloride, cellulose triacetate, polycarbonate, or polyethylene napthalate, or a metal belt of Al, aluminum alloy, Ti, titanium alloy or stainless steel.

The evaporation source may be heated by a resistance heating method, a laser beam heating method, a high frequency heating method or an electron beam heating method. In order to form the vapor beam, a method may be employed in which a wire-shaped or bar-shaped material is supplied to a heating source.

In the vacuum deposition, oxidizing gas, acitve gas or inert gas may be employed.

It is preferable that the flexible belt 27 be a metal belt made of Al, Cu, Ti or stainless steel.

We claim:

1. A magnetic recording medium manufacturing apparatus for depositing a material onto a medium, said apparatus comprising:

first and second rollers for transporting said medium; and evaporating means for evaporating said material for deposit onto said medium between said first and second rollers at an oblique angle with respect to the surface of said medium;

said first roller being disposed closer to said evaporating means than said second roller, whereby said medium is transported past said evaporating means at an oblique angle;

an endless belt support surrounding said first and second rollers, said medium being supported on said endless belt support between said first and second roller; and said first roller is smaller in diameter than said second roller and said second roller is a cooling rotary cylinder can for cooling said medium.

2. An apparatus, as claimed in claim 1, wherein said medium is tape-shaped.

3. An apparatus, as claimed in claim 1, wherein said first and second rollers are arranged in a substantial vacuum.

4. An apparatus, as claimed in claim 1, wherein said evaporating means is disposed below said first and second rollers.

5. An apparatus, as claimed in claim 1, wherein said material is a ferromagnetic material.

* * * * *